United States Patent
Lee et al.

(10) Patent No.: US 9,966,281 B2
(45) Date of Patent: May 8, 2018

(54) METHODS AND SYSTEMS FOR CHEMICAL MECHANICAL POLISH CLEANING

(71) Applicant: Taiwan Semiconductor Manufacturing Company, Ltd., Hsin-Chu (TW)

(72) Inventors: Chien-Ping Lee, Taipei (TW); Hui-Chi Huang, Zhubei (TW)

(73) Assignee: TAIWAN SEMICONDUCTOR MANUFACTURING COMPANY, LTD., Hsin-Chu (TW)

( * ) Notice: Subject to any disclaimer, the term of this patent is extended or adjusted under 35 U.S.C. 154(b) by 246 days.

(21) Appl. No.: 14/081,693

(22) Filed: Nov. 15, 2013

(65) Prior Publication Data
US 2015/0140818 A1 May 21, 2015

(51) Int. Cl.
| | |
|---|---|
| H01L 21/02 | (2006.01) |
| H01L 21/67 | (2006.01) |
| H01L 21/306 | (2006.01) |
| B08B 3/02 | (2006.01) |
| B08B 1/00 | (2006.01) |
| B24B 37/34 | (2012.01) |

(52) U.S. Cl.
CPC ........ H01L 21/67051 (2013.01); B24B 37/34 (2013.01); H01L 21/02071 (2013.01); H01L 21/67028 (2013.01); H01L 21/67046 (2013.01)

(58) Field of Classification Search
None
See application file for complete search history.

(56) References Cited

U.S. PATENT DOCUMENTS

| | | | | |
|---|---|---|---|---|
| 5,571,560 A * | 11/1996 | Lin | ............... | B05C 5/0208 118/305 |
| 5,578,529 A * | 11/1996 | Mullins | ............... | B24B 37/005 134/33 |
| 5,850,841 A * | 12/1998 | Han | ............... | H01L 21/67051 134/198 |
| 5,868,866 A * | 2/1999 | Maekawa | ............... | B08B 1/007 134/1 |
| 6,247,479 B1 * | 6/2001 | Taniyama | ............... | B08B 3/024 134/133 |
| 6,540,841 B1 * | 4/2003 | Roy | ............... | B08B 3/04 134/6 |
| 6,660,124 B1 * | 12/2003 | Kawasaki | ............... | B24B 53/017 156/345.12 |
| 6,667,238 B1 * | 12/2003 | Kimura | ............... | B24B 37/345 156/345.12 |
| 6,699,356 B2 * | 3/2004 | Bachrach | ............... | H01L 21/6708 156/345.11 |

(Continued)

Primary Examiner — Sylvia R MacArthur
(74) Attorney, Agent, or Firm — Haynes and Boone, LLP (57) ABSTRACT

The present disclosure provides a cleaning unit for a chemical mechanical polishing (CMP) process. The cleaning unit comprises a cleaning solution; a brush configured to scrub a wafer during the CMP process; and a spray nozzle configured to apply the cleaning solution to the wafer when the brush scrubs the wafer during the CMP process. In some embodiments, the spray nozzle includes an inlet where the cleaning solution enters the spray nozzle and an outlet where the cleaning solution exits the spray nozzle. In some embodiments, an inlet area ($A_0$) is different from an outlet area ($A_1$).

20 Claims, 7 Drawing Sheets

(56) References Cited

U.S. PATENT DOCUMENTS

| | | | | |
|---|---|---|---|---|
| 7,077,731 B1* | 7/2006 | Zhang | ............... | B08B 1/04 451/194 |
| 7,650,897 B2* | 1/2010 | Kopp | ............... | B05B 1/205 134/198 |
| 2001/0010103 A1* | 8/2001 | Konishi | ............... | B08B 1/04 15/77 |
| 2004/0185584 A1* | 9/2004 | Lin | ............... | H01J 37/32935 438/9 |
| 2004/0235308 A1* | 11/2004 | Sato | ............... | H01L 21/02052 438/704 |
| 2007/0223342 A1* | 9/2007 | Orii | ............... | H01L 21/02052 369/69 |
| 2008/0035603 A1* | 2/2008 | Lee | ............... | C23F 1/08 216/13 |
| 2008/0173335 A1* | 7/2008 | Yoon | ............... | H01L 21/67028 134/62 |
| 2011/0081486 A1* | 4/2011 | McCamy | ............... | C23C 16/4401 427/255.19 |
| 2011/0290178 A1* | 12/2011 | Shimai | ............... | B05D 1/002 118/75 |
| 2012/0024317 A1* | 2/2012 | Kitamura | ............... | B24B 53/017 134/6 |
| 2014/0213056 A1* | 7/2014 | Lu | ............... | H01L 21/67046 438/692 |
| 2015/0140818 A1* | 5/2015 | Lee | ............... | B24B 37/34 438/692 |
| 2015/0170940 A1* | 6/2015 | Lin | ............... | H01L 21/67046 156/345.12 |

* cited by examiner

METHODS AND SYSTEMS FOR CHEMICAL MECHANICAL POLISH CLEANING

BACKGROUND

The semiconductor integrated circuit (IC) industry has experienced rapid growth. Technological advances in IC materials and design have produced generations of ICs where each generation has smaller and more complex circuits than the previous generation. However, these advances have increased the complexity of processing and manufacturing ICs and, for these advances to be realized, similar developments in IC processing and manufacturing are needed.

In the course of IC evolution, functional density (i.e., the number of interconnected devices per chip area) has generally increased while geometry size (i.e., the smallest component or line that can be created using a fabrication process) has decreased. This scaling down process generally provides benefits by increasing production efficiency and lowering associated costs. Such scaling-down also produces a relatively high power dissipation value, which may be addressed by using low power dissipation devices such as complementary metal-oxide-semiconductor (CMOS) devices. CMOS devices have typically been formed with a gate oxide and polysilicon gate electrode. There has been a desire to replace the gate oxide and polysilicon gate electrode with a high-k gate dielectric and metal gate electrode to improve device performance as feature sizes continue to decrease. In other schemes of metal integration, some form of damascene processing may be involved in which patterns are etched into a dielectric and then the patterns are filled with metal layers by blanket deposition onto the wafer surface, for example by chemical vapor deposition (CVD).

Chemical mechanical polishing (CMP) has become a key technology driver to achieve local or global wafer planarization for submicron advanced semiconductor ICs. The CMP process is used to planarize and remove excess metal over the dielectric and to produce a planar semiconductor structure wherein the metal lines or plugs, barrier metal, and exposed dielectric surfaces are coplanar. An improved method and systems for CMP cleaning are highly desired.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

It is to be understood that the following disclosure provides many different embodiments, or examples, for implementing different features of the invention. Specific examples of components and arrangements are described below to simplify the present disclosure. These are, of course, merely examples and are not intended to be limiting. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Various features may be arbitrarily drawn in different scales for simplicity and clarity. In addition, although the present disclosure provides examples of a damascene process and a "gate last" metal gate process, one skilled in the art may recognize applicability to other processes and/or use of other materials.

Figure 1:
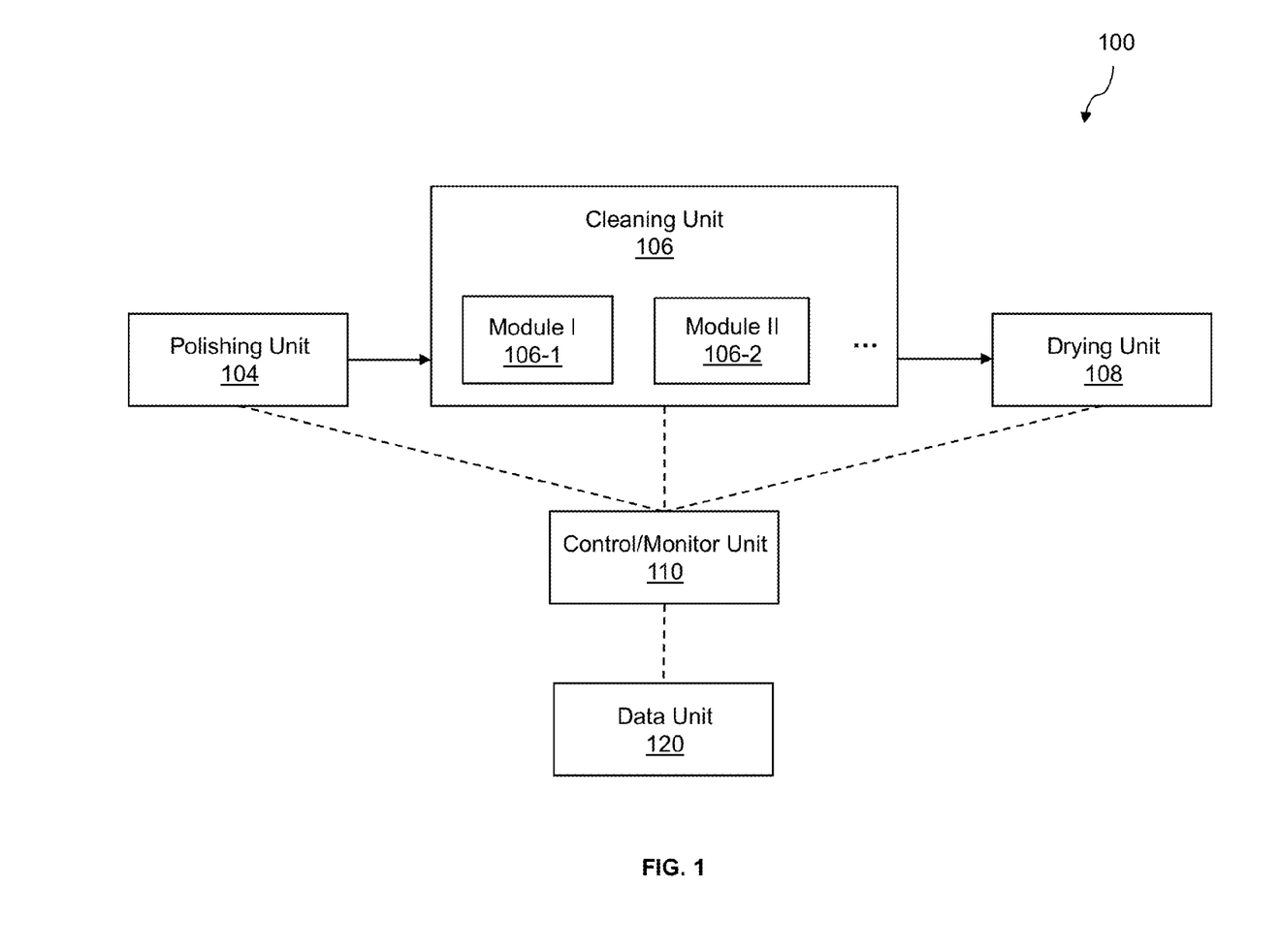
FIG. 1 is a block diagram of a chemical mechanical polish (CMP) system for implementing one or more embodiments of the present invention.

FIG. 1 is a block diagram of a chemical mechanical polish (CMP) system 100 for implementing one or more embodiments of the present invention. As shown in FIG. 1, the CMP system 100 includes a polishing unit 104, a cleaning unit 106, and a drying unit 108. In some embodiments, one or more robot arms may be used to transfer and handle one or more wafers simultaneously or individually as required among the polishing unit 104, the cleaning unit 106 and the drying unit 108.

The polishing unit 104 may include components for planarizing a metal layer or a dielectric layer over a wafer, such as one or more polishing pads configured to polish wafers. The polishing unit 104 may also include one or more polishing heads, a polishing slurry supply, a water supply, a wafer loading mechanism, and other necessary components. In some embodiments, the CMP slurry may be suspended in a mild etchant, such as potassium or ammonium hydroxide. The CMP slurry may include ferric nitrate, peroxide, potassium iodate, ammonia, silica, alumina, and/or other slurry materials are applicable.

The cleaning unit 106 may include one or more modules 106-1, 106-2, etc. Each module may also include polyvinyl alcohol (PVA) brush scrubbers, megasonic cleaners, a chemical drip manifold, and/or spray nozzles. In some embodiments, each of the modules (e.g., modules 106-1, 106-2, etc.) may be configured to spray a cleaning solution that is different from the cleaning solutions of the other modules.

The drying unit 108 may include a vacuum baking chamber or a furnace with a heating source, such as heating coils, gases, and/or lamps, which may supply heat to dry one or more wafers at a time. The drying unit 108 may further include an inert gas supply for supplying an inert gas such as nitrogen, helium, argon, or mixtures thereof to the baking chamber. A vacuum pump may be used for controlling the pressure and environment within the baking chamber.

Referring to FIG. 1, in some embodiments, the CMP system 100 also includes a control/monitor unit 110 coupled to and configured to monitor and/or control the polishing unit 104, the cleaning unit 106, and the dying unit 108. In some embodiments, the control/monitor unit 110 may be designed to monitor and collect CMP data, such as the polishing rate from the one or more polishing pads of the polishing unit 104. In some embodiments, the control/monitor unit 110 may also be designed to monitor and control the cleaning unit 106. For example, the control/monitor unit 110 may be used to monitor and control the flow rate of the cleaning solution, the positions of the spray nozzles, and/or the working speed of the brush scrubbers.

Still referring to FIG. 1, in some embodiments, various analysis and processes of the CMP data may be implemented by a data unit 120 coupled to the control/monitor unit 110. In some examples, the data unit 120 may be a component of the control/monitor unit 110 designed for CMP data analysis. In some embodiments, the CMP data include various existing CMP processing data associated with the polishing unit 104 and the cleaning unit 106, such as CMP system history data, cleaning history data, metrology tool data, and statistical process control (SPC) data. In some examples, the CMP system history data includes polishing rate, CMP failure information, system maintenance record data, and/or polishing pad replacement record data. The cleaning history data may also include flow rate of the cleaning solution, spray nozzle distribution data, and/or cleaning solution spraying information. The SPC data includes polishing rate and out of specification (OOS) records. In some embodiments, the CMP data may be stored in a computer readable media.

Some common forms of computer readable media includes, for example, floppy disk, flexible disk, hard disk, magnetic tape, any other magnetic medium, CD-ROM, any other optical medium, punch cards, paper tape, any other physical medium with patterns of holes, RAM, PROM, EPROM, FLASH-EPROM, any other memory chip or cartridge, carrier wave, or any other medium from which a computer is adapted to read.

Figure 2:
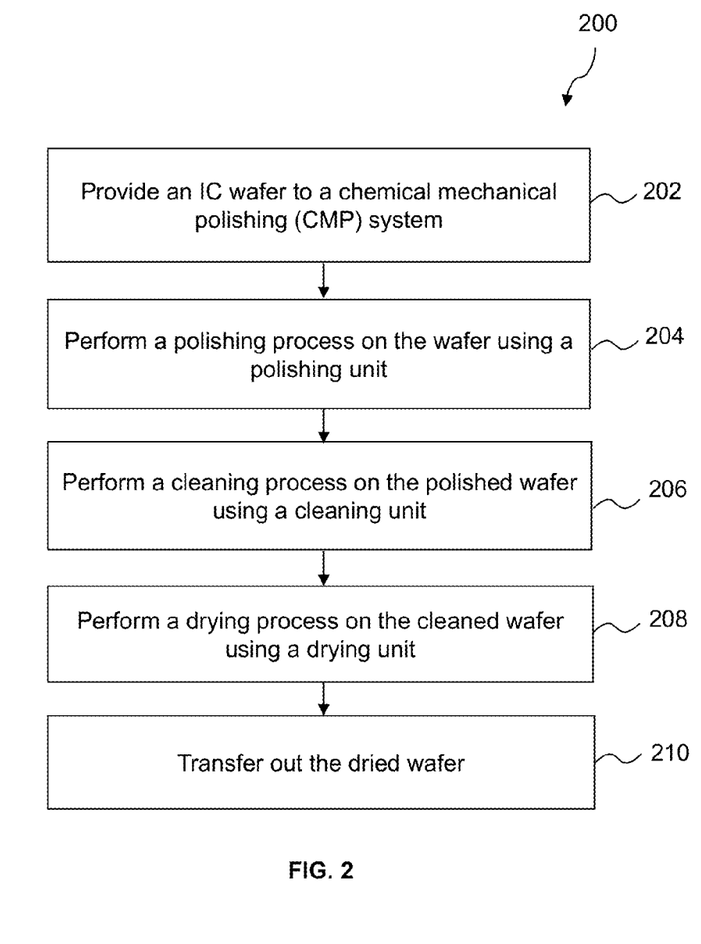
FIG. 2 is a flowchart of a chemical mechanical polishing (CMP) method for fabricating a semiconductor device including an integrated circuit (IC) wafer according to various embodiments of the present disclosure.
Figure 3A:
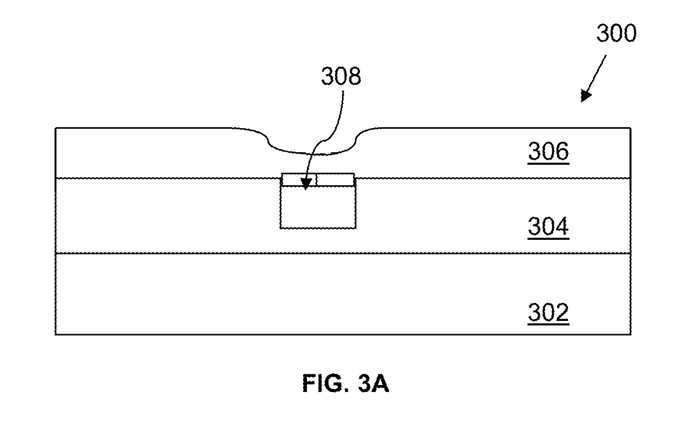
FIGS. 3A-3B illustrate cross-sectional views of an IC wafer at various stages of fabrication using to the CMP method of FIG. 2 according to various embodiments of the present disclosure.
Figure 3B:
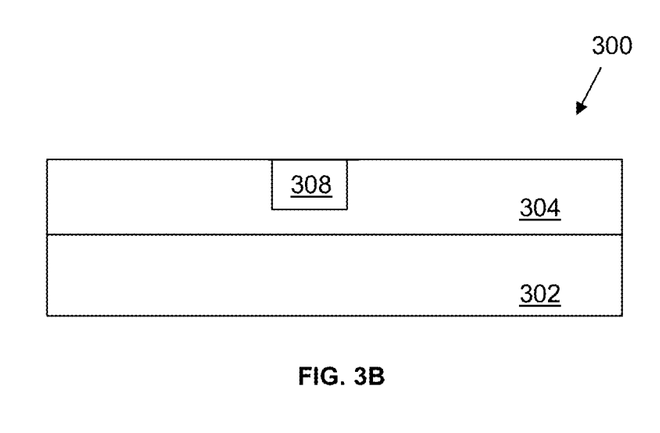

FIG. 2 is a flowchart of a chemical mechanical polishing (CMP) method 200 for fabricating a semiconductor device including an integrated circuit (IC) wafer 300 according to various embodiments of the present disclosure. FIGS. 3A-3B illustrate cross-sectional views of the IC wafer 300 at various stages of fabrication according to the CMP method 200 of FIG. 2. It is to be understood that additional processes may be provided before, during, and after the CMP method 200 of FIG. 2.

Referring to FIGS. 2 and 3A, the method 200 begins with step 202 by providing the IC wafer 300 to the CMP system 100 to perform the CMP method 200. In some embodiments, the IC wafer 300 includes a substrate 302. The substrate 302 may be a silicon wafer. The substrate 302 may also include another elementary semiconductor, such as germanium; a compound semiconductor including silicon carbide, gallium arsenic, gallium phosphide, indium phosphide, indium arsenide, and/or indium antimonide; or an alloy semiconductor including SiGe, GaAsP, AlInAs, AlGaAs, GaInAs, GaInP, and/or GaInAsP. In some alternative embodiments, the wafer 222 includes a semiconductor on insulator (SOI).

Referring to FIG. 3A, the IC wafer 300 may also include a dielectric layer 304 formed over the substrate 302. The dielectric layer 304 may include silicon oxide. In some examples, the dielectric layer 304 may additionally or alternatively include silicon nitride, silicon oxynitride, or other suitable dielectric material. In some embodiments, one or more trenches 308 may be formed in the dielectric layer 304 by photolithographic patterning and etch techniques as are known in the art, such as by the use of photoresist patterning and dry etching.

Still referring to FIG. 3A, the IC wafer 300 may also include a metal layer 306 formed over the dielectric layer 304 and filled in the one or more trenches 308. In some embodiments, the metal layer 306 may include aluminum (Al), copper (Cu), tungsten (W), nickel (Ni), titanium (Ti), gold (Au), and platinum (Pt) and, thereof an alloy of the metals. The metal layer 306 may have a non-flat surface as shown in FIG. 3A, therefore there is a need for the CMP process 200 to be applied to the IC wafer 300 to planarize the top surface. In some examples, the metal layer 306 in the trench 308 may form a metal gate during a gate-last process.

Referring to FIGS. 2 and 3B, the method 200 continues to step 204 by performing a polishing process on the IC wafer 300 using the polishing unit 104. The polishing process may be performed on the metal layer 306, and the dielectric layer 304, to remove excess metal (e.g., metal outside of the trench 308 in FIG. 3A), thereby exposing and making coplanar a top surface of the metal layer 306 and the dielectric layer 304, as shown in FIG. 3B. In some embodiments, the polishing process may include mounting the wafer on rotating holders and lowering the wafer onto a pad or table head surface rotating in the opposite direction. The rotating wafer may then be pressed face-down against the rotating polishing pad and the slurry may be pressed against the wafer by the pad. During the polishing process, a combination of chemical and physical effects removes excessive features from the wafer surface. In some examples, a typical CMP processing includes: (1) chemical action involving hydroxyl ions attacking silicon oxide, causing surface softening and chemical dissolution, and oxidants enhancing metal dissolution; and (2) mechanical action involving polishing rotation and pressure.

Referring to FIGS. 2 and 3B, the method 200 proceeds to step 206 by performing a cleaning process on the polished wafer using a cleaning unit 106. In some embodiments, the cleaning process may include buffing, brush cleaning, megasonic cleaning, and/or a spin-rinse cycle. In some embodiments, wafers may be buffed using soft pads, oxide slurries, deionized (DI) water, or ammonium hydroxide following the polishing process. In some embodiments, brush cleaning the planarized or polished wafer includes scrubbing the wafer with a cleaning solution to remove residue from the polishing process. Typical scrubbers may include one or more rotating cylindrical brushes that contact and brush the slurry residue, particles, and other contaminants from a wafer surface. Double-sided scrubbers may simultaneously scrub the top and bottom surfaces of a wafer with two rotating cylindrical brushes. Each wafer may lie flat on a conveyor mechanism which moves the wafer into and between the brushes. When the wafer is being scrubbed, the conveyor mechanism, rollers, and brushes may support and hold the wafer horizontally or vertically. One or more rollers may engage the edge of the semiconductor wafer to rotate the wafer while one or both surfaces are scrubbed by the brushes. The cleaning solution may include a surfactant, an acid, an alkaline, DI water, or any other suitable cleaning chemistry. In some embodiments, the cleaning solution includes at least one of hydrofluoric acid, citric acid, ammonium hydroxide, or deionized water to remove particles, metal, and oxide. In some embodiments, megasonic cleaning, such as using sound waves and cleaning chemicals to clean the wafer, may be included in the cleaning process. In some embodiments, the cleaning process may further comprise a rinsing process including spinning and rinsing the wafer with isopropyl alcohol (IPA). The rinsing process with IPA may be performed using a cleaning module that is different from the cleaning modules used for buffing, brush cleaning, or megasonic cleaning.

Still referring to FIGS. 2 and 3B, the method 200 proceeds to step 208 by performing a drying process on the cleaned wafer. In some embodiments, the drying process includes vacuum baking the cleaned wafer in an inert gas environment. In some examples, the vacuum baking process is performed at a temperature between about 25 degrees Celsius and about 400 degrees Celsius, at a pressure between about 0.1 torr and about 760 torr, in an inert gas environment including nitrogen, helium, argon, or mixtures thereof, and for less than five minutes. Drying the cleaned wafer in the inert gas environment may prevent or hinder (1) corrosion of the exposed surface of the metal layer 306, (2) moisture adhesion onto the exposed surface of the metal layer 306 from water in the atmosphere (i.e., promotes water desorption), and (3) pitting on the exposed surface of metal layer 306. In some embodiments, the drying process may be performed using the drying unit 108 of the CMP system 100. In some alternative embodiments, the drying process may also be performed in a stand-alone unit.

The method 200 may proceed to step 210 by transferring out the dried wafer 300 with in-situ inert gas for further processing. The inert gas may include nitrogen, helium, argon, or mixtures thereof. In some embodiments, the CMP process 200 may create the topography on which subsequent layers are built. It is understood that the IC wafer 300 may undergo further processing to form various features such as capping dielectrics, contacts/vias, interconnect metal layers, interlayer dielectric, passivation layers, etc.

Figure 4A:
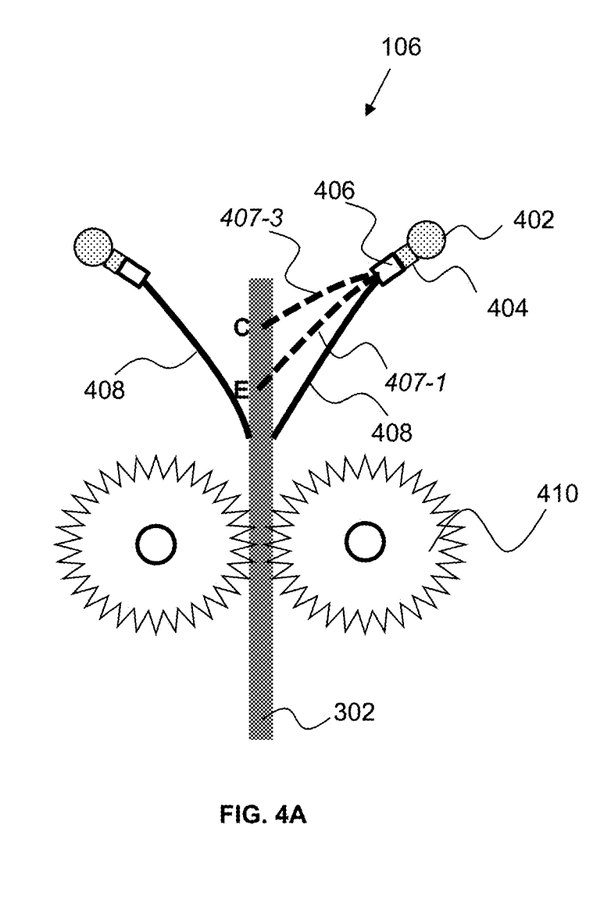
FIGS. 4A-4B are schematic drawings of side and front views respectively illustrating a cleaning unit cleaning an IC wafer according to some embodiments of the present invention.
Figure 4B:
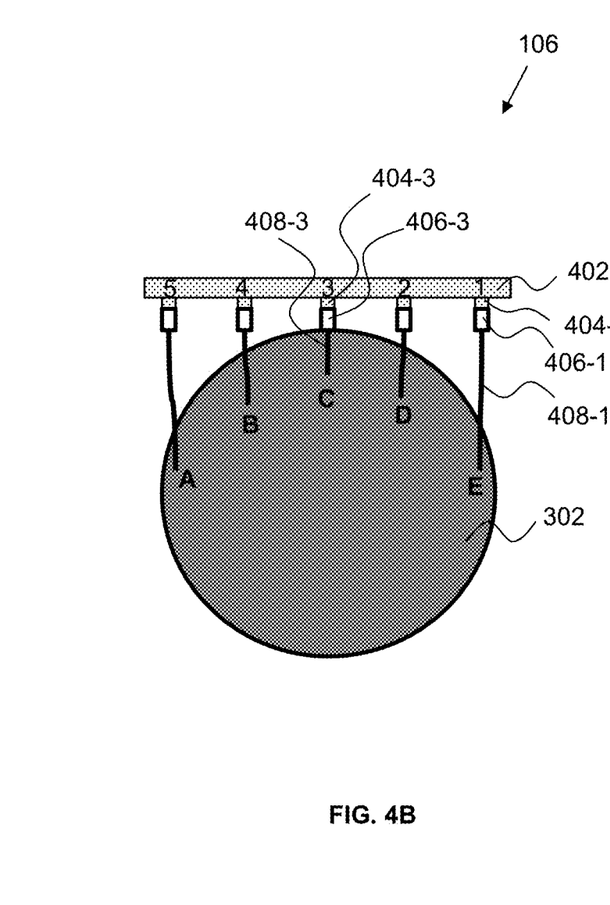

FIGS. 4A-4B are schematic drawings of side and front views illustrating a cleaning unit 106 cleaning an IC wafer 302 according to some embodiments of the present invention. It is to be understood that although the cleaning unit 106 is shown to be a vertical unit, the embodiments discussed in the current invention may be applicable to a horizontal unit. As shown in FIGS. 4A-4B, the cleaning unit 106 includes a spray bar 402, one or more spray manifolds (e.g., spray manifolds 404-1 to 404-5) attached or coupled to the spray bar 402, one or more spray nozzles (e.g., spray nozzles 406-1 to 406-5) coupled to the spray manifolds correspondingly, and one or more brushes 410 configured to clean the surface(s) of the wafer 302. In some embodiments, a clean solution (e.g., solution 408) may be supplied by the spray nozzle 406 to be sprayed onto the IC wafer 302, and the brushes 410 may rotate to remove chemical residue from the polishing process. In some embodiments, the brushes 410 may include one or more rotating cylindrical brushes 410 that contact and brush the slurry residue, particles, and other contaminants from the wafer surface. The wafer 302 may also rotate while one or both surfaces are scrubbed by the brushes.

In some examples as shown in FIG. 4B, it may be desirable to have the cleaning solutions 408-1 to 408-5 being sprayed out of the spray nozzles 406-1 to 406-5 to arrive at the appropriate locations (e.g., spots A, B, C, D, and E) on the wafer 302. The appropriate locations may be predetermined on the wafer 302 so that as the wafer 302 rotates during the cleaning process, the cleaning solutions 408-1 to 408-5 may be homogenously distributed and spread, and the brushes may effectively and efficiently clean the surface(s) of the wafer 302. In some embodiments when the spray nozzles 406-1 to 406-5 have the identical configuration, it may be necessary to adjust the flow rate of the cleaning solution coming out of each spray nozzle 406, so that the cleaning solution 408 may arrive at the predetermined locations on the wafer 302. For example as shown in FIG. 4A, the cleaning solution 407-1 coming out of the spray nozzle 406-1 may have a first flow rate of 500 ml/min to arrive at spot E, and the cleaning solution 407-3 coming out of the spray nozzle 406-3 may have a second flow rate of 2500 ml/min to arrive at spot C. However, the change in the flow rate may result in different velocities and/or directions of the cleaning solution exiting the outlet. Moreover, it is possible that some spray nozzles may not be able to spray the cleaning solutions onto the wafer 302.

Figure 4C:
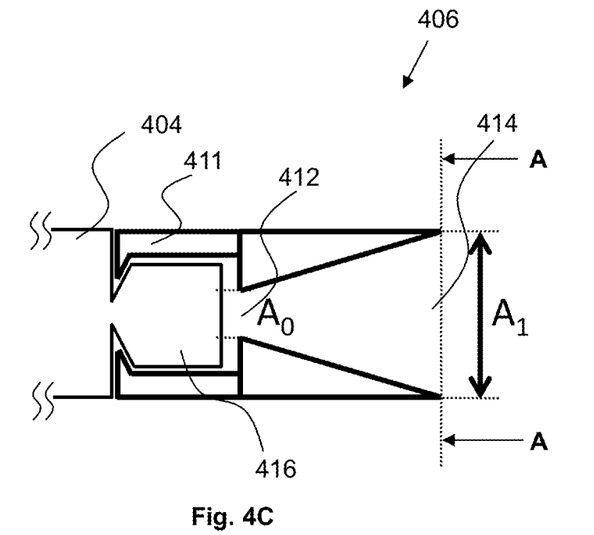
FIGS. 4C and 4E are schematic drawings of the side views of various configurations of spray nozzles of the cleaning unit according to various embodiments of the present invention.
Figure 4D:
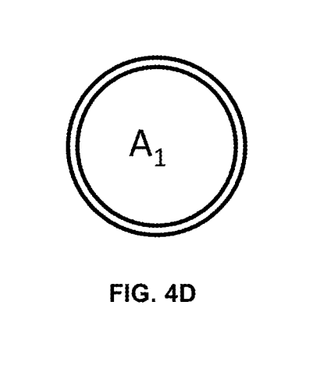
FIGS. 4D and 4F are schematic drawings of the spray nozzles along the line A-A in FIGS. 5A and 5C at various embodiments of the present invention.
Figure 4E:
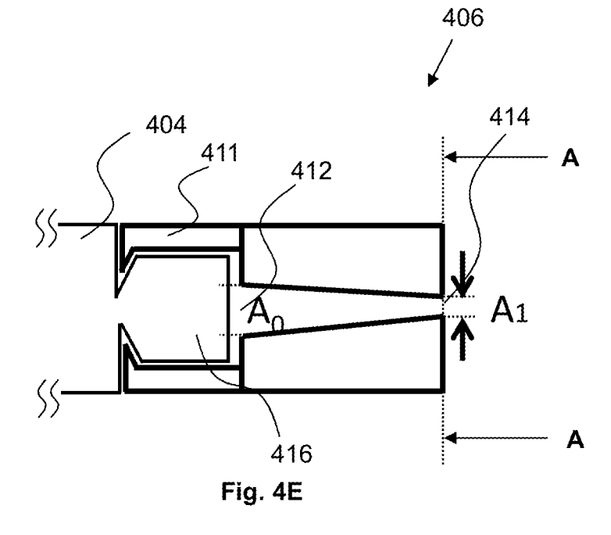
Figure 4F:
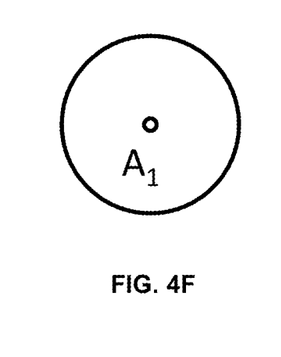

In order to have better control of the cleaning solution, for example, better controlled velocity and/or direction of the cleaning solution exiting the outlet of the nozzle, the spray nozzles 406 may be designed and manufactured to have different configurations as shown in FIGS. 4C-4G. FIGS. 4C and 4E are schematic drawings of the side views of various configurations of spray nozzles 406 of the cleaning unit 106 according to various embodiments of the present invention. FIGS. 4D and 4F are schematic drawings of the spray nozzles 406 along the line A-A in FIGS. 4C and 4E respectively at various embodiments of the present invention. In some examples, a spray nozzle 406 may be designed and manufactured to have a certain type of the configuration including outlet numbers and distribution on the spray nozzle. In some examples, a spray nozzle 406 may also be designed and manufactured to be interchangeable among a plurality of configurations, (e.g., outlet number and distributions) using any suitable technique.

Referring to FIGS. 4C and 4E, the spray nozzle 406 includes a lock part 411, an inlet 412 and an outlet 414. In some embodiments, the lock part 411 may be made from materials including polytetrafluoroethylene (PTFE). The lock part 411 may be coupled to the spray manifold 404 by clipping to a protruding portion 416 of the spray manifold 404. This feature of the lock part 411 of the spray nozzle 406 makes it possible to change the spray nozzle 406 in an easy and quick way.

As shown in FIGS. 4C-4F, the spray nozzle 406 may have different areas of the inlet 412 and the outlet 414. For example, the spray nozzle 406 has an inlet area $(A_0)$ of the inlet 412, and an outlet area of $(A_1)$ of the outlet 414. In some examples, the inlet area $A_0$ of the inlet 412 may be less than the outlet area $A_1$ of the outlet 414 as shown in FIG. 4C, so that the solution velocity entering the inlet 412 is greater than the solution velocity exiting the outlet 414. In some examples, the inlet area $A_0$ of the inlet 412 may be greater than the outlet area $A_1$ of the outlet 414 as shown in FIG. 4E, so that the solution velocity entering the inlet 412 is less than the solution velocity exiting the outlet 414. Therefore, by choosing the outlet area $A_1$ for each spray nozzle, the solution velocity exiting the spray nozzle may be controlled so that the cleaning solution may arrive at the desirable spots on the wafer even when the cleaning solution enters each spray nozzle at the same flow rate.

Figure 4G:
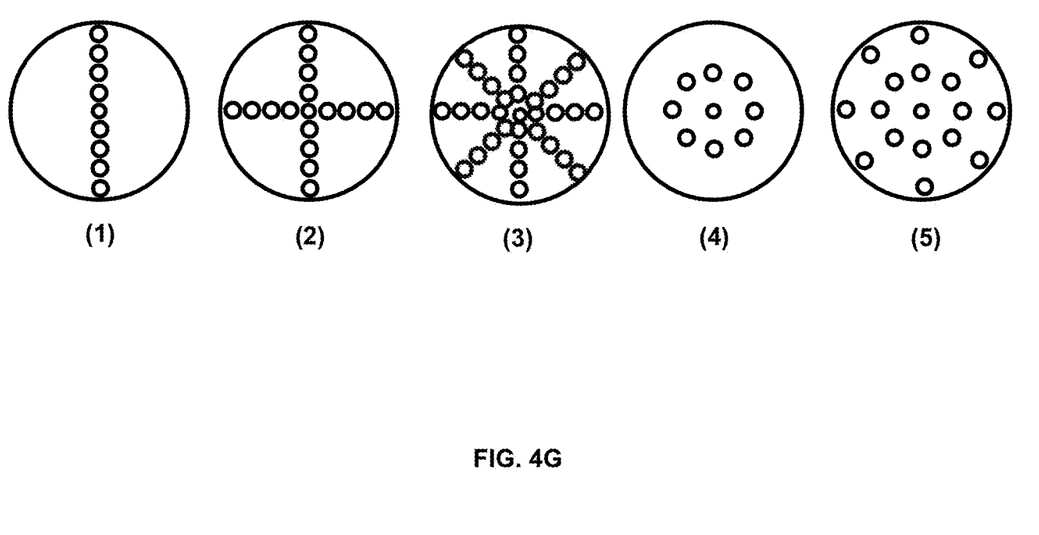
FIG. 4G shows schematic drawings illustrating different configurations of the outlet of the spray nozzle according to various embodiments of the present invention.

FIG. 4G shows schematic drawings illustrating different configurations of the outlet 414 of the spray nozzle according to various embodiments of the present invention. As shown in FIG. 4G, each spray nozzle 406 may include a plurality of outlets 414 with various distributions and configurations. For example, the first spray nozzle shown in FIG. 4G may include 9 outlets arranged in a line. The second spray nozzle shown in FIG. 4G may include 17 outlets arranged in a cross. The fourth spray nozzle shown in FIG. 4G may include 9 outlets, out of which 8 outlets are arranged in a circle surrounding the ninth outlet.

Table 1 lists some examples of the different configurations of the outlets on the spray nozzle, and compares the outlet areas ("Area") of the spray nozzles. When the spay nozzles are used to apply cleaning solutions onto the wafer, the horizontal distance ("Distance") between the exiting outlet 414 of the spray nozzle 406 and the arriving spot on the wafer 302 are also compared in Table 1. The horizontal distance may be related to the solution velocity in the horizontal direction when exiting the spray nozzle. As listed in Table 1, when the flow rate of the cleaning solution entering the inlet 412 of different spray nozzles 406 is the same, the spray nozzle with a greater outlet area $A_1$ may result in a less solution velocity when exiting the spray nozzle, as evidenced by the shorter horizontal distance. For example, when the outlet area $A_1$ is selected to be X (spray nozzle (2) of Table 1), the horizontal distance is assumed to be D related to a horizontal velocity V exiting the spray nozzle. When the outlet area $A_1$ is selected to be 50× (spray nozzle (1) of Table 1), the horizontal velocity may be reduced to be $(1/50)$V which results in the shorter horizontal distance of 0.02 D. When the spray nozzle includes a plurality of outlets 414, the outlet area $A_1$ of the spray nozzle is a sum of the cross sectional areas of all the outlets on the spray nozzle. For example, the spray nozzle may include 9 outlets arranged in a line (spray nozzle (3) of Table 1), and each outlet has an area of X. The outlet area ($A_1$) of the spray nozzle (3) is 9×, the horizontal velocity may be reduced to be $(1/9)$V, and the horizontal distance is about 0.11 D. It is to be understood that the listed configurations of the spray nozzles are merely exemplary embodiments and are not intended to be limiting. A person having ordinary skill in the art would be able to understand that the cleaning unit 106 may include any kind of spray nozzle including any numbers of outlets with any suitable configuration.

polishing slurries. The wafer 302 may be transferred to the cleaning unit 106 to remove the residue slurry from the wafer 302.

Figure 5:
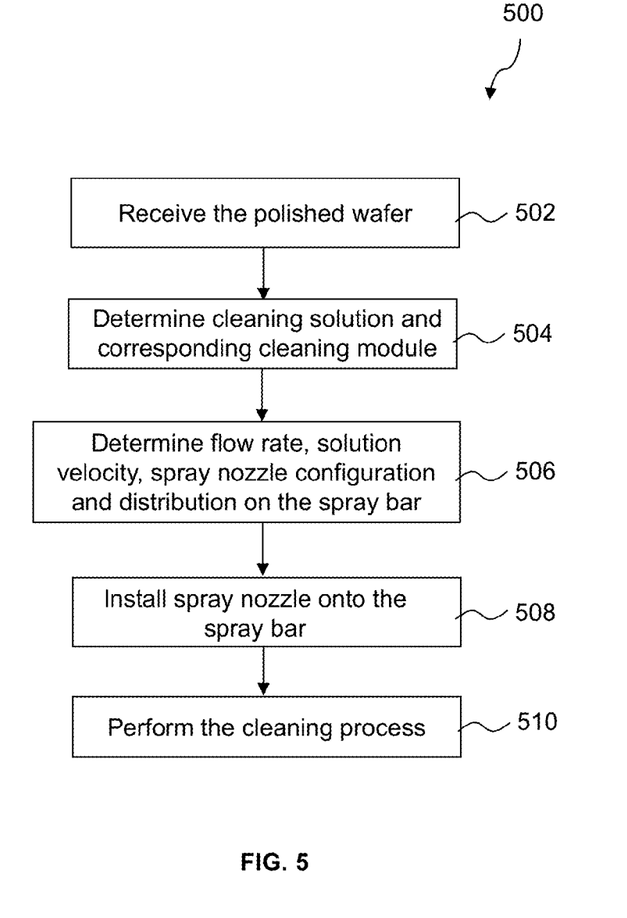
FIG. 5 is a flowchart of a method for a cleaning process using a CMP system according to various embodiments of the present disclosure.

The method 500 proceeds to step 504 by determining the cleaning solution and corresponding cleaning module (e.g., modules 106-1, 106-2 . . . as shown in FIG. 1). In some embodiments, each cleaning module may be used to apply a certain type of cleaning solution during the cleaning process. The cleaning solution applied by one cleaning module may be different from that of other cleaning modules. The control/monitor unit 110 of the CMP system 100 may monitor and collect the polishing history data, such as the polishing slurries used in the polishing process 204. The collected polishing history data may be stored in the data unit 120 and used to determine the type of cleaning solution to be used during the cleaning process. The cleaning solution includes at least one of hydrofluoric acid, citric acid, ammonium hydroxide, or deionized water to remove particles, metal, and oxide. In some embodiments, it may be determined to have the wafer cleaned using more than one cleaning modules with different cleaning solutions at a desirable sequence.

The method 500 proceeds to step 506 by determining the flow rate and the solution velocity/direction of the cleaning solution. At step 506, the configuration of each spray nozzle and the distribution of the plurality of spray nozzles on the spray bar 402 may also be determined to provide the determined flow rate and the solution velocity/direction. In some embodiments, the cleaning history data stored in the data unit 120 may include flow rate of the cleaning solution, distribution data of the spray nozzles, and/or information related to cleaning solution. Depending on the desired cleaning process, the cleaning history data and the position data of the wafer situated in the cleaning unit may be used to determine the flow rate of the cleaning solution to be applied on the wafer. In some embodiments, the velocity and/or direction of the cleaning solution exiting the outlet of

TABLE 1

Comparison of outlet areas and configurations of spray nozzles

| Same Flow Rate | (1) | (2) | (3) | (4) | (5) | (6) | (7) |
|---|---|---|---|---|---|---|---|
| Area ($A_1$) | 50X | X | 9X | 17X | 32X | 9X | 17X |
| Distance | 0.02D | D | 0.11D | 0.06D | 0.03D | 0.11D | 0.06D |

FIG. 5 is a flowchart of a method 500 for a cleaning process using a CMP system 100 according to various embodiments of the present disclosure. The cleaning unit 106 of the CMP system 100 may include a spray bar 402 configured to hold a plurality of spray nozzles 406 as discussed with respect to FIG. 4B, and the plurality of spray nozzles 406 may have various configurations as discussed with respect to FIGS. 4C-4G. It is to be understood that additional processes may be provided before, during, and after the method 500 of FIG. 5. Some steps shown in FIG. 5 may also be optional for the method 500.

The method 500 starts from step 502 by receiving the polished wafer processed as discussed with respect to step 204 of method 200 of FIG. 2. In some embodiments, the wafer may be the IC wafer 302 as discussed in FIG. 3A, and the wafer 302 may be polished using one or more pads and the spray nozzle may also be determined to optimize the location of the cleaning solution arrives on the wafer. In some embodiments, different cleaning modules may apply different cleaning solutions at different flow rates from each other onto the wafer. The configurations and distributions of the plurality of spray nozzles 406 may be determined using the related information, such as the spray nozzle information listed in FIGS. 4C, 4E and Table 1. In some examples when each spray nozzle 406 is designed and manufactured to have a configuration with a certain cross sectional area and outlets distribution, the spray nozzle capable of providing the determined flow rate and solution velocity/direction may be chosen to be installed on the spray bar 402. In some examples, in order to homogeneously spray and spread the cleaning solution from the spray nozzles onto the wafer, the distribution of the plurality of spray nozzles with different configurations on the spray bar 402 may also be determined.

The method 500 proceeds to step 508 by installing the chosen spray nozzles 406 on the spray bar 402 according to the determined configuration and distribution from step 506. Referring to each spray nozzle 406 as shown in FIGS. 4C and 4E, the lock part 411 may be coupled to the spray manifold 404 by clipping to a protruding portion of the spray manifold 404.

The method 500 proceeds to step 510 to perform the cleaning process using the arranged configurations from the previous steps. The step 510 may be substantially similar to step 206 of method 200 as discussed with respect to FIG. 2. In some embodiments, step 510 may also include transferring the wafers among a plurality of modules in the cleaning unit 106.

The present disclosure provides a cleaning unit for a chemical mechanical polishing (CMP) process. The cleaning unit comprises a cleaning solution; a brush configured to scrub a wafer during the CMP process; and a spray nozzle configured to apply the cleaning solution to the wafer when the brush scrubs the wafer during the CMP process. In some embodiments, the spray nozzle includes an inlet where the cleaning solution enters the spray nozzle, and an outlet where the cleaning solution exits the spray nozzle. In some embodiments, an inlet area ($A_0$) is different from an outlet area ($A_1$).

In some embodiments, the inlet area ($A_0$) is greater than the outlet area ($A_1$).

In some embodiments, the inlet area ($A_0$) is less than the outlet area ($A_1$).

In some embodiments, the cleaning unit further comprises a spray bar configured to hold a plurality of the spray nozzles. The spray bar may be connected to one or more spray manifolds, each of which may include a protruding portion. In some embodiments, each of the plurality of the spray nozzles includes a lock part coupled to a corresponding spray manifold by clipping to the protruding portion of the corresponding spray manifold. In some embodiments, the lock part is made from materials including polytetrafluoroethylene (PTFE).

In some embodiments, the outlet area ($A_1$) of the spray nozzle corresponds to a solution velocity of the cleaning solution exiting the outlet of the spray nozzle, and the outlet area ($A_1$) of the spray nozzle is determined to control a location where the cleaning solution arrives on the wafer.

In some embodiments, the plurality of the spray nozzles on the spray bar are arranged so that the outlet area ($A_1$) of each of the plurality of the spray nozzles is selected to have the cleaning solution arrive at a predetermined location on the wafer.

In some embodiments, the spray nozzle includes one or more outlets, the outlet area ($A_1$) being a sum of areas of the one or more outlets. In some embodiments, the cleaning unit further comprises a plurality of the spray nozzles being arranged so that the outlet area ($A_1$) of each of the plurality of the spray nozzles is selected to have the cleaning solution from arrive at a predetermined location on the wafer.

In some embodiments, the cleaning solution of the cleaning unit includes at least one of hydrofluoric acid, citric acid, ammonium hydroxide, or deionized water.

The present disclosure also provides a chemical mechanical polishing (CMP) system comprising a polishing unit including components for planarizing a material layer over a wafer; a cleaning unit coupled to the polishing unit and configured to clean the planarized material layer over the wafer, and a drying unit coupled to the cleaning unit and configured to dry the cleaned wafer. In some embodiments, the cleaning unit includes a spray nozzle configured to apply a cleaning solution to the wafer. In some embodiments, the spray nozzle includes an inlet where the cleaning solution enters the spray nozzle, and an outlet where the cleaning solution exits the spray nozzle. In some embodiments, an inlet area ($A_0$) is different from an outlet area ($A_1$).

In some embodiments, the polishing unit includes a slurry supply and one or more polishing pads configured to polish the material layer.

In some embodiments, the outlet area (A1) of the spray nozzle corresponds to a solution velocity of the cleaning solution exiting the spray nozzle. The outlet area (A1) of the spray nozzle is determined to control a location where the cleaning solution arrives on the wafer.

In some embodiments, the CMP system further comprises a first cleaning unit configured to apply a first cleaning solution at a first solution velocity to the wafer, and a second cleaning unit configured to apply a second cleaning solution at a second solution velocity to the wafer. In some embodiments, the first cleaning solution is different from the second cleaning solution, and the first solution velocity is different from the second solution velocity.

In some embodiments, the spray nozzle includes a lock part coupled to a corresponding spray manifold by clipping to a protruding portion of the corresponding spray manifold.

The present disclosure also discloses a method of fabricating a semiconductor device comprising providing an integrated circuit (IC) wafer; planarizing the IC wafer using a polishing unit; cleaning the planarized IC wafer to remove residues using a cleaning unit; and drying the cleaned wafer using a drying unit. In some embodiments, the cleaning unit includes a first cleaning module having a first group of spray nozzles configured to provide a first cleaning solution, and a second cleaning module having a second group of spray nozzles configured to provide a second cleaning solution that is different from the first cleaning solution. In some embodiments, each of the first and second groups of spray nozzles has an inlet area ($A_0$) that is different from an outlet area ($A_1$).

In some embodiments, the outlet area ($A_1$) of each spray nozzle corresponds to a solution velocity of a cleaning solution exiting each spray nozzle, and the outlet area ($A_1$) of each spray nozzle is determined to control a location where the cleaning solution arrives on the IC wafer.

In some embodiments, cleaning the planarized IC wafer further comprises determining a cleaning solution to be applied on the IC wafer and a corresponding cleaning module configured to provide the determined cleaning solution; determining a solution velocity of the cleaning solution exiting the outlet, and configurations of the first and second groups of the spray nozzles; and installing the first and second groups of spray nozzles onto first and second spray bars respectively by coupling a lock part of each spray nozzle to a spray manifold by clipping to a protruding portion of the spray manifold.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A cleaning unit for a chemical mechanical polishing (CMP) process, the cleaning unit comprising:
a brush configured to scrub a wafer during the CMP process; and
spray nozzles, each of the spray nozzles configured to apply a cleaning solution to the wafer when the brush scrubs the wafer during the CMP process,
wherein each of the spray nozzles includes an inlet where the cleaning solution enters the respective spray nozzle, and one or more outlets where the cleaning solution exits the respective spray nozzle, the inlet having an inlet area, the one or more outlets collectively having an outlet area; and wherein at least two of the spray nozzles have same inlet area and different outlet areas, wherein the inlets of the at least two of the spray nozzles are physically separate from each other.

2. The cleaning unit of claim 1, wherein the inlet area of one of the spray nozzles is less than the outlet area of the one of the spray nozzles.

3. The cleaning unit of claim 1, further comprising a spray bar configured to hold the spray nozzles.

4. The cleaning unit of claim 3, wherein the spray bar is connected to one or more spray manifolds, each including a protruding portion.

5. The cleaning unit of claim 4, wherein each of the spray nozzles includes a lock part coupled to a corresponding spray manifold by clipping to the protruding portion of the corresponding spray manifold.

6. The cleaning unit of claim 5, wherein the lock part is made from materials including polytetrafluoroethylene (PTFE).

7. The cleaning unit of claim 1, wherein multiple outlets of one of the spray nozzles have substantially same shape.

8. The cleaning unit of claim 1, wherein multiple outlets of one of the spray nozzles are configured symmetrically about a center of the one of the spray nozzles.

9. The cleaning unit of claim 1, wherein multiple outlets of one of the spray nozzles are configured in a straight line or multiple straight lines.

10. The cleaning unit of claim 1, wherein multiple outlets of one of the spray nozzles are configured in a circle or multiple concentric circles.

11. A chemical mechanical polishing (CMP) system, the CMP system comprising:
a polishing unit including components for planarizing a material layer over a wafer;
a cleaning unit coupled to the polishing unit and configured to clean the planarized material layer over the wafer, the cleaning unit including a brush configured to scrub the wafer, and spray nozzles configured to apply a cleaning solution to the wafer when the brush scrubs the wafer; and
a drying unit coupled to the cleaning unit and configured to dry the cleaned wafer,
wherein each of the spray nozzles includes an inlet having an inlet area where the cleaning solution enters the spray nozzle and one or more outlets collectively having an outlet area where the cleaning solution exits the spray nozzle, wherein at least two of the spray nozzles have same inlet area and different outlet areas, wherein the inlets of the at least two of the spray nozzles are physically separate from each other, and the outlets of the at least two of the spray nozzles are also physically separate from each other.

12. The CMP system of claim 11, wherein the polishing unit includes a slurry supply and one or more polishing pads configured to polish the material layer.

13. The CMP system of claim 11, wherein the spray nozzle includes a lock part coupled to a corresponding spray manifold by clipping to a protruding portion of the corresponding spray manifold.

14. A chemical mechanical polishing (CMP) system, comprising:
a cleaning unit, wherein the cleaning unit includes:
a brush configured to scrub a wafer during a CMP process;
a spray bar; and
spray nozzles attached to the spray bar and configured to apply a cleaning solution to the wafer when the brush scrubs the wafer during the CMP process,
wherein each of the spray nozzles includes an inlet having an inlet area where the cleaning solution enters the spray nozzle and one or more outlets collectively having an outlet area where the cleaning solution exits the spray nozzle; wherein at least two of the spray nozzles have same inlet area and different outlet areas, wherein the inlets of the at least two of the spray nozzles are physically separate from each other.

15. The CMP system of claim 14, further comprising:
a polishing unit coupled to the cleaning unit, the polish unit including components for planarizing a material layer over the wafer; and
a drying unit coupled to the cleaning unit and configured to dry the wafer after it is cleaned by the cleaning unit.

16. The CMP system of claim 14, wherein the inlet area of one of the spray nozzles is smaller than the outlet area of the one of the spray nozzles.

17. The CMP system of claim 14, wherein multiple outlets of one of the spray nozzles are configured symmetrically about a center of the one of the spray nozzles.

18. The CMP system of claim 14, wherein multiple outlets of one of the spray nozzles have substantially same shape and size.

19. The CMP system of claim 14, wherein the inlet area of one of the spray nozzles is greater than the outlet area of the one of the spray nozzles.

20. The CMP system of claim 14, wherein the at least two of the spray nozzles have different numbers of outlets.

* * * * *